United States Patent
Zhang et al.

(12) 
(10) Patent No.: US 6,292,401 B1
(45) Date of Patent: Sep. 18, 2001

(54) METHOD AND APPARATUS FOR GLOBAL BITLINE MULTIPLEXING FOR A HIGH-SPEED MEMORY

(75) Inventors: Kevin X. Zhang; Thomas D. Fletcher, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/661,664

(22) Filed: Sep. 14, 2000

(51) Int. Cl.[7] .................................................. G11C 7/00
(52) U.S. Cl. ................................ 365/189.02; 365/63
(58) Field of Search ........................ 365/230.02, 189.02, 365/63, 230.06

(56) References Cited

U.S. PATENT DOCUMENTS

| | | | |
|---|---|---|---|
| 5,561,626 | * 10/1996 | Fujii | 365/149 |
| 5,701,269 | * 12/1997 | Fujii | 365/210 |
| 5,828,594 | * 10/1998 | Fujii | 365/63 |
| 6,091,633 | * 7/2000 | Cernea et al. | 365/185.13 |

* cited by examiner

*Primary Examiner*—Tan T. Nguyen
(74) *Attorney, Agent, or Firm*—Cynthia T. Faatz

(57) ABSTRACT

A memory. For one aspect, the memory comprises memory cells that are arranged in columns. The memory also includes a global bitline that is shared by at least two of the columns of memory cells. During a memory read operation, the global bitline is responsive to data stored in one or more of the at least two columns of memory if either of the at least two columns of memory is to be read from.

15 Claims, 4 Drawing Sheets

METHOD AND APPARATUS FOR GLOBAL BITLINE MULTIPLEXING FOR A HIGH-SPEED MEMORY

BACKGROUND

1. Field

An embodiment of the present invention relates to the field of high frequency integrated circuits and, more particularly, to a global bitline multiplexing approach that may be used for high-speed memory.

2. Discussion of Related Art

High-speed memory design has become increasingly important to the overall performance of processors and systems, for example. One of the larger components of memory latency and, therefore, keys to high performance memory design, may be bitline sensing. For a cache memory, for example, bitline sensing can account for as much as two thirds of total cache latency.

A conventional memory 100 may be arranged as shown in FIG. 1. For the configuration shown in FIG. 1, one global bitline 105 is provided for each column 101 and 102 of memory cells. While only two columns of memory cells are shown in FIG. 1, it will be appreciated that the memory 100 may include a larger number of columns of memory cells with an additional global bitline being provided for each additional column of memory. Further, where the memory is a multi-ported memory, there may be multiple global bitlines per column of memory to correspond to the multiple ports (i.e. one global bitline per column per port).

Local bitlines 107 are coupled to clusters of memory cells such as the clusters 111–114 of memory cells. The clusters of memory cells 111–114 may include, for example, eight memory cells. The memory 100 may include additional clusters of memory cells in each column.

In operation, in response to a read request, local bitline(s) 107 coupled to a memory row to be read indicate a logical value stored in a corresponding memory cell. If any local bitline 107 coupled to a global bitline indicates a logical zero value, the corresponding global bitline (through a NAND gate 115 in this example) is pulled down. Thus, for the example of FIG. 1, multiple global bitlines are typically switched in response to a memory read request if more than one memory cell in the row being read stores a logical zero value.

In response to a column select signal, a multiplexer (mux) 120 then selects between signals communicated over multiple global bitlines 105 and outputs the selected data. Multiple levels of multiplexing (not shown) may be used to provide the desired output data in response to the read request.

In the memory 100, because global bitlines may be switched even when a corresponding column is not selected to be read, power consumption of such a memory may be unnecessarily and undesirably high.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for global bitline multiplexing for use in a high-speed memory are described. In the following description, particular types of integrated circuits and circuit configurations are described for purposes of illustration. It will be appreciated, however, that other embodiments are applicable to other types of integrated circuits and to circuits configured in another manner.

For one embodiment, a memory includes a plurality of memory cells arranged in columns. The memory also includes a global bitline that is shared by at least two of the columns of memory cells. During a memory read operation, the global bitline is responsive to data stored in one or more of the at least two columns of memory if either of the at least two columns of memory is to be read from. Further details of this and other embodiments are described below in reference to the Figures.

Figure 2:
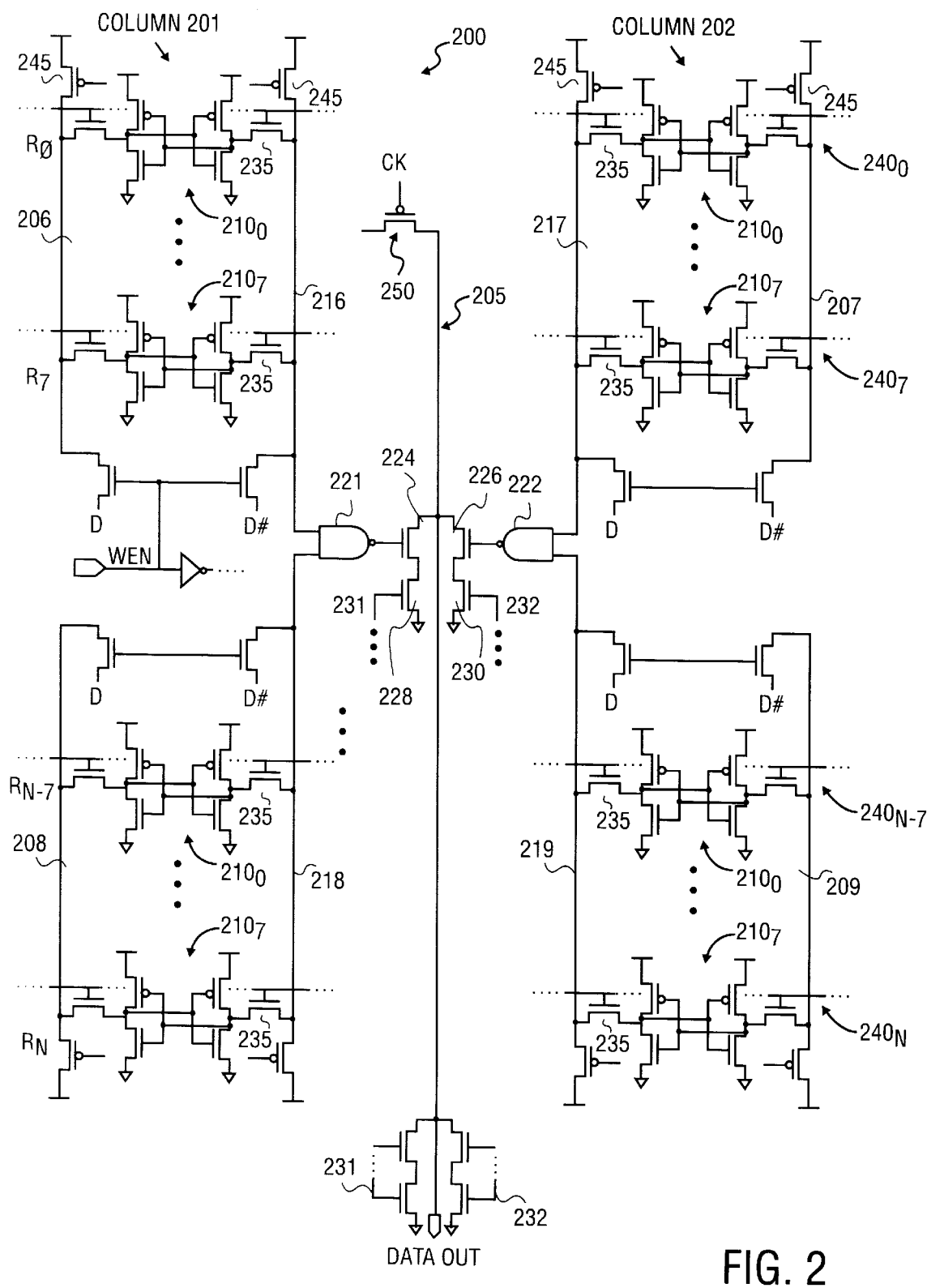
FIG. 2 is a schematic diagram of a memory including a bitline sensing approach in accordance with one embodiment of the invention.

FIG. 2 is a schematic diagram of a memory 200 including a bitline sensing scheme in accordance with one embodiment. The memory 200 is arranged in columns such as the columns 201 and 202. Although only two columns of memory cells are shown in FIG. 2, it will be appreciated, that the memory 200 may include a larger number of columns. For one embodiment, at least one global bitline 205 is shared by two adjacent columns of memory cells 201 and 202. For another embodiment, each global bitline in the memory is shared by at least two columns of memory cells.

Within the columns 201 and 202, the memory cells of the memory 200 also are further grouped in clusters 206–209. For one embodiment, each cluster of memory cells includes eight memory cells $210_0$–$210_8$, only two of which are shown in each cluster in FIG. 2. For another embodiment, one or more of the clusters 206–209 may include a different number of memory cells.

Each cluster of memory cells 206–209 is coupled to a corresponding local bitline 216–219, respectively. Each cluster of memory cells 206–209 may also be coupled to a complementary local bitline, wherein both local bitlines corresponding with a cluster of memory cells may be used during a memory write operation. Local bitlines 216 and 218 are coupled to inputs of a NAND gate 221 and local bitlines 217 and 219 are coupled to inputs of a NAND gate 222. An output of the NAND gate 221 is coupled to a gate of a data transistor 224 while an output of the NAND gate 222 is coupled to a gate of a data transistor 226.

For the exemplary memory 200 of FIG. 2, for each set of two clusters of memory cells, the pull-down path for the global bitline 205 also includes a column select transistor coupled in series with a corresponding data transistor. Thus, for the clusters 206 and 208, a column select transistor 228 is coupled in series with the data transistor 224 and, for the clusters 207 and 209, a column select transistor 230 is coupled in series with the data transistor 226. Each of the column select transistors 228 and 230 for this embodiment has one terminal coupled to ground and a gate coupled to receive a column select signal over a corresponding column select line 231 or 232. For one embodiment, the column select signal received over the column select line 231 is a complement of the column select signal received over the column select line 232. While the column select lines 231 and 232 are shown as broken lines, it will be appreciated that a single column select line may extend across column select transistors corresponding to an entire column of memory cells. Other memory cells in the memory 200 are arranged and coupled to corresponding global bitlines in a similar manner.

In addition to columns, the exemplary memory 200 is also arranged in rows. Rows $R_0$–$R_N$ are shown in FIG. 2. For example, the memory cell $210_0$ in the cluster of memory cells 206 and the memory cell $210_0$ in the cluster of memory cells 207 are both in row $R_0$. Each row of memory cells is coupled to a corresponding row select line 240 (shown as select lines $240_0$–$240_N$) which may alternately be referred to as a wordline. While the wordlines or row select lines 240 of FIG. 2 are illustrated as broken lines, it will be appreciated that each wordline may extend across an entire row of memory cells.

In operation, prior to a memory read or write operation, local bitlines including the local bitlines 216–219 are precharged high for one embodiment, by precharge devices 245 in response to a precharge signal (not shown). The global bitlines, including the global bitline 205, are also precharged high by global bitline precharge devices similar to a global bitline precharge device 250 in response to, for example, a clock signal (Ck) going low.

Then, in response to a memory read request, a selected row of memory cells is activated to be read by a row select signal received over one of the wordlines 240. The row select signal may be generated by row decoding logic (not shown) in response to a read request that includes an address of memory cell(s) to be read in a manner well-known to those of ordinary skill in the art. The row select signal is received at a gate of a row select transistor 235 for each memory cell in the row to be read.

For purposes of example, it is assumed that the selected row is the row including the memory cells $210_7$ in the clusters of memory cells 206 and 207. Thus, the row select signal is communicated over the wordline $240_7$. In response, each of the memory cells in the selected row $R_7$ communicates a value stored in the memory cell to a local bitline coupled to the memory cell. For example, if the memory cell $210_7$ in the memory cluster 206 stores a logical zero while the memory cell $210_7$ in the memory cluster 207 stores a logical one, the local bitline 216 is pulled low while the local bitline 217 remains high.

For this example, one input to the NAND gate 221 is then low such that an output of the NAND gate 221 is high and the data transistor 224 is enabled. Both inputs to the NAND gate 222 remain high such that the output of the NAND gate 222 remains low and the data transistor 226 is not enabled.

If, instead, however, the memory cell $210_7$ in the memory cluster 206 and the memory cell $210_7$ in the memory cluster 207 both store a logical zero, both of the local bitlines 216 and 217 are pulled low.

For this example, one input to the NAND gate 221 is then low such that an output of the NAND gate 221 is high and the data transistor 224 is enabled. One input to the NAND gate 222 is also low such that the output of the NAND gate 222 is also high and the data transistor 226 is also enabled.

Assuming it is the memory cell $210_7$ in the cluster 206 that is to be read, the column select transistor 228 is enabled in response to receiving a column select signal. The column select transistor 230 is not enabled because the column select signal 232 at the gate of the column select transistor 230 is a complement of the column select signal 231 at the gate of the column select transistor 231. Enabling the column select transistor 228 in conjunction with the data transistor 224 being enabled and the clock (Ck) signal being high during a read operation, causes the global bitline 205 to be pulled down (switched). In this manner, the global bitline 205 is responsive to data stored in the memory cell(s) being read. The column select signal may be generated by column decode logic (not shown) in response to a memory read request and a corresponding address of memory cell(s) to be read in a manner well-known to those of ordinary skill in the art.

Figure 1:
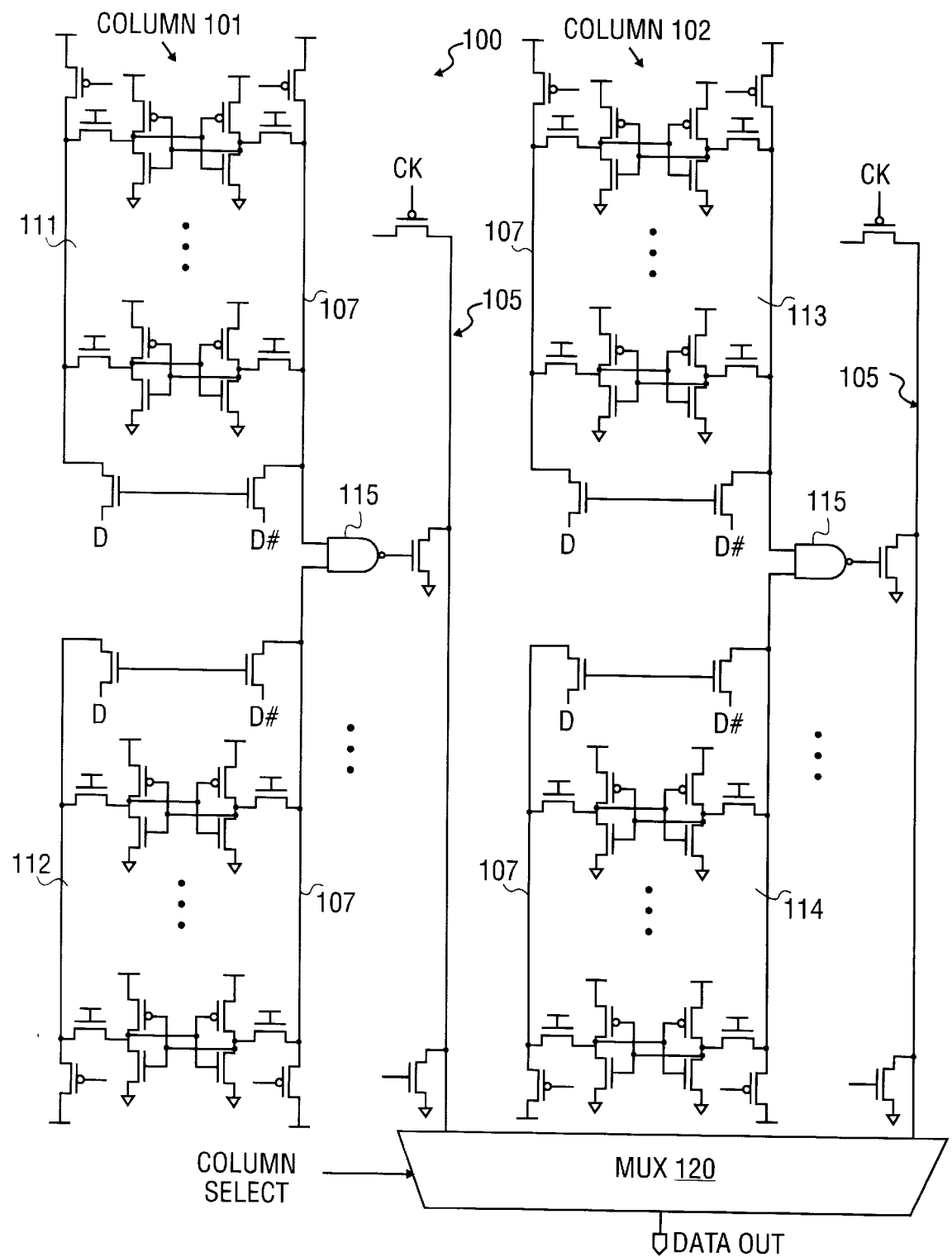
FIG. 1 is a schematic diagram of a memory including a prior bitline sensing approach.

According to the above-described operation, the column select transistors of one embodiment, such as the column select transistors 228 and 230, effectively perform the two-to-one multiplexing function of the multiplexer 120 in the circuit of FIG. 1. (Further multiplexing may be performed using subsequent circuitry not shown in FIG. 2). Using the column select transistors 228 and 230 as shown in FIG. 2, however, it is possible for two columns of memory to share a single global bitline. In this manner, the number of metal tracks for global bitlines is cut in half as compared to the memory 100 of FIG. 1. This can be advantageous for a number of reasons.

For a memory array, the cell width is typically fixed. The number of metal tracks that can be run over a cell is limited by the cell width. Therefore, by cutting the number of global bitline tracks in half, it may be possible to increase the signal bandwidth in the memory design due to the extra space available. For a multi-ported memory, this advantage may be even more significant.

Further, the ability to use only one global bitline for two columns of memory may save power. In the memory 100 of FIG. 1, all of the global bitlines 105 in the memory 100 may be switched in response to a memory read request with the desired signal(s) being selected by the multiplexer 120 (and possibly other levels of multiplexing) after the global bitlines are activated. In the embodiment of FIG. 2, however, only one global bitline may be activated for every two columns of memory because the 2:1 column multiplexing operation is performed by the column select transistors earlier, before signals propagate through the global bitlines.

Additionally, in accordance with the memory structure shown in FIG. 2, column select signals may be easily combined with write enable signals to prevent local bitline switching during a write operation from propagating to the global bitlines.

For the prior memory shown in FIG. 1, such a combination is not straightforward. Because the column select signal is provided as an input to the multiplexer 120, even if a write enable signal and column select signal were to be logically combined, such a combination would not prevent global bitlines 105 from switching in response to local bitline switching during a memory write operation. Unnecessary switching of the global bitlines 105 can undesirably increase power consumption of the memory 100.

Figure 3:
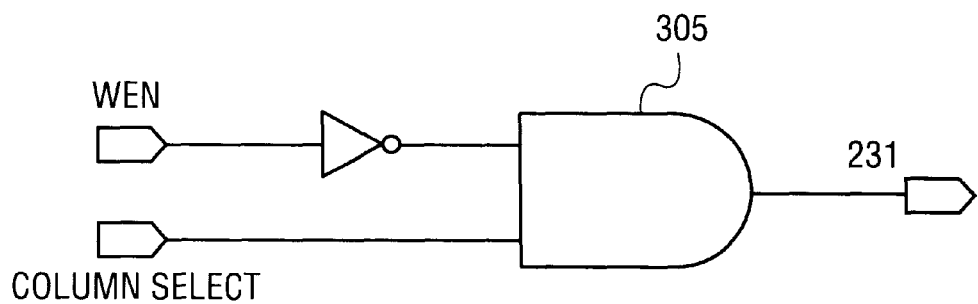
FIG. 3 is a logic diagram showing an exemplary approach to logically combining write enable and column select signals in the memory of FIG. 2.

For the memory 200 of FIG. 2, however, for one embodiment, as shown in FIG. 3, a write enable (WEN) signal corresponding to the column 201 may be inverted and provided as one input to an AND gate 305 with the other input to the AND gate being coupled to receive the corresponding column select signal. An output of the AND gate 305 then provides the input signal 231 to the gate of the column select transistor 228 such that the column select transistor is disabled during a memory write operation when a write enable signal is high. The write enable signal may be generated, for example, in response to a write request and a corresponding address of memory cell(s) to be written as is well-known to those of ordinary skill in the art.

Other approaches to combining the write enable signal and column select signals to prevent the global bitline 205 from switching during a memory write operation are within the scope of various embodiments. Further, while only one write enable signal line is shown in FIG. 2, it will be appreciated that write enable signals associated with other memory cell clusters may be combined with corresponding column select signals in a similar manner.

For other embodiments, different types of memory cells organized in a different manner from those shown in FIG. 2 may be used. For example, while a single-ported memory is shown in FIG. 2, a multi-ported memory may be used for other embodiments. Where the memory is a multi-ported memory, global bitlines are shared between two columns of memory for each read port.

Figure 4:
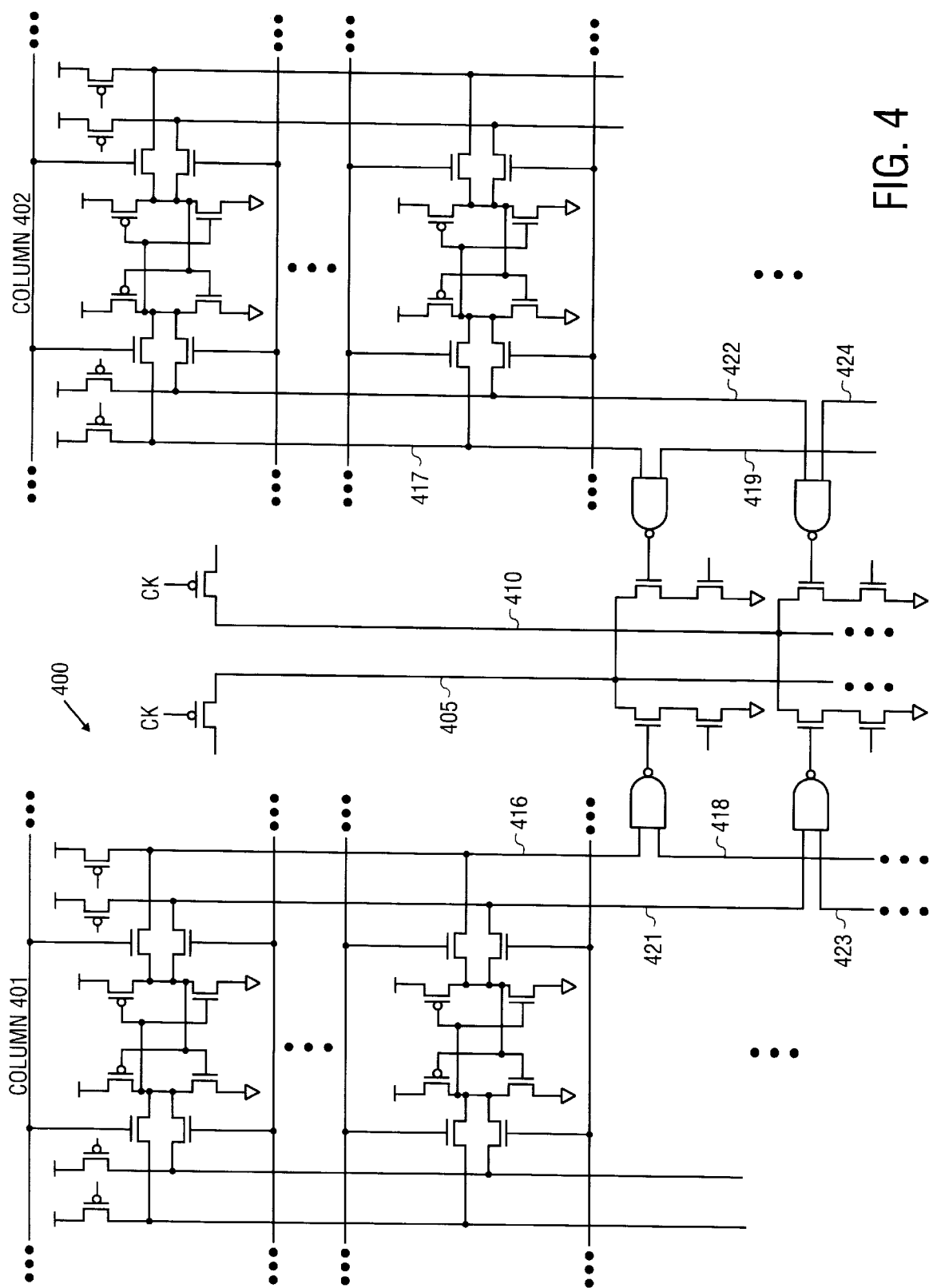
FIG. 4 is a schematic diagram of a dual-port memory including a bitline sensing approach in accordance with one embodiment.

FIG. 4 shows an example of a dual-ported memory 400. For the dual-ported memory 400, the global bitline 405 is shared between a first read port of a first column of memory cells 401 and a first read port of a second column of memory cells 402. The first read port of the column 401 of memory cells is coupled to local bitlines 416 and 418 as shown while the first read port of the column 402 of memory cells is coupled to the local bitlines 417 and 419.

For this embodiment, another global bitline 410 is shared between a second read port of the column 401 of memory cells and a second read port of the column 402 of memory cells. The second read port of the column 401 of memory cells is coupled to the local bitlines 421 and 423 while the second read port of the column 402 of memory cells is coupled to the local bitlines 422 and 424 as shown.

For the dual-ported memory 400 of FIG. 4, the global bitline(s) that are activated depend, not only on column and row select signals, but also on the particular read port selected. Each of these select signals is generated by decoding logic (not shown) in a manner well-known to those of ordinary skill in the art.

Other aspects of the operation of the memory 400 are similar to those described above in reference to the memory 200 of FIG. 2.

For another embodiment, additional read ports may be included with a corresponding increase in the number of shared global bitlines.

Additionally, for either single or multi-ported memories, complementary logic and/or signals may be used for some embodiments. For still other embodiments, global bitlines may be shared by more than two columns of memory and/or by more than two read ports where additional decoding logic is provided to activate the appropriate column select signals. Other variations of the above-described embodiments will be appreciated by those of ordinary skill in the art.

Figure 5:
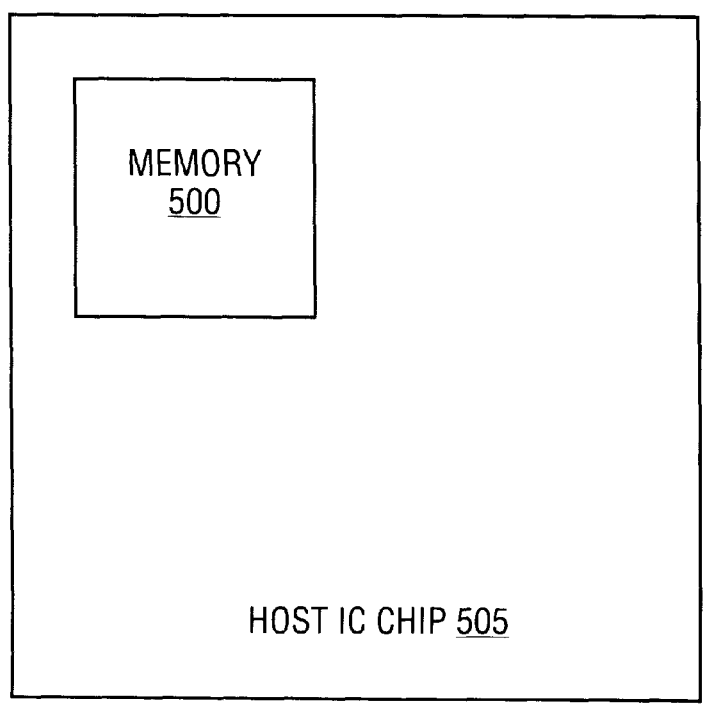
FIG. 5 is a high-level block diagram showing an on-chip memory that may be similar in configuration and operation to the memory of FIG. 2 or the memory of FIG. 4.

FIG. 5 shows an exemplary on-chip memory 500 that may benefit from the global bitline multiplexing approach of various embodiments. For one embodiment, the on-chip memory is a cache memory organized in a similar manner to the memory 200 of FIG. 2 or the memory 400 of FIG. 4 and the host integrated circuit chip 505 is a microprocessor For other embodiments, the on-chip memory 500 may be a register file or a different type of memory and/or the host integrated circuit chip 505 may be a different type of integrated circuit chip.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory comprising:
    a plurality of memory cells arranged in columns; and
    a global bitline that is shared by at least two of the columns of memory cells, the global bitline, during a memory read operation, being responsive to data stored in one or more of the at least two columns of memory when one of the at least two columns of memory is to be read from.

2. The memory of claim 1 further comprising:
    a column select transistor coupled to the global bitline for each column of memory cells coupled to the global bitline, the column select transistors to perform a multiplexing operation to selectively enable the global bitline in response to a column select line if one of the columns of memory cells coupled to the global bitline is to be read from.

3. The memory of claim 2 wherein
    a write enable signal corresponding to a first column of memory cells is logically combined with the column select signal corresponding to the first column of memory cells such that a global bitline corresponding to the first column of memory cells is prevented from switching during a memory write operation to the first column of memory cells.

4. The memory of claim 1 further comprising:
    multiple read ports per memory cell, wherein
        the global bitline is shared by one read port of each of the at least two columns of memory cells.

5. The memory of claim 4 wherein
each global bitline in the memory is shared by at least one read port of each of at least two columns of memory.

6. The memory of claim 1 wherein
the memory cells are included within a cache memory.

7. The memory of claim 1 wherein
the memory cells are included within a register file.

8. An apparatus comprising:
    an integrated circuit chip; and
    a memory included within the integrated circuit chip, the memory comprising:
        an array of memory cells arranged in columns, and a global bitline that is shared by at least two columns of the memory cells, the global bitline being responsive to data stored in one or more of the at least two columns of memory when one of the at least two columns of memory is to be read from.

9. The apparatus of claim 8 wherein the memory is a cache memory and the integrated circuit chip is a processor.

10. The apparatus of claim 8 wherein the memory is a register file and the integrated circuit chip is a processor.

11. The apparatus of claim 8 wherein
    the memory is a multi-ported memory, and
    the global bitline is shared by one read port of each of at least two columns of the memory cells.

12. The apparatus of claim 8 wherein the memory further comprises:
    a column select transistor coupled to the global bitline for each column of memory cells coupled to the global bitline, the column select transistors to perform a multiplexing operation to selectively enable the global bitline in response to a column select line if one of the columns of memory cells coupled to the global bitline is to be read from.

13. The apparatus of claim 12 wherein, a write enable signal corresponding to a first column of memory cells is logically combined with the column select signal corresponding to the first column of memory cells such that a global bitline corresponding to the first column of memory cells is prevented from switching during a memory write operation to the first column of memory cells.

14. A method comprising:

receiving a memory read request; and performing a multiplexing operation by activating a global bitline in response data stored in one or more of at least two columns of memory coupled to the global bitline when one of the at least two columns of memory is to be read from.

15. The method of claim 14 further comprising:

logically combining a write enable signal with a column select signal to prevent the global bitline from switching during a memory write operation.

* * * * *